(12) United States Patent
Allen

(10) Patent No.: US 7,613,263 B2
(45) Date of Patent: Nov. 3, 2009

(54) CLOCK AND DATA RECOVERY METHOD AND APPARATUS

(75) Inventor: Daniel J. Allen, Derry, NH (US)

(73) Assignee: Altera Corporation, San Jose, CA (US)

( * ) Notice: Subject to any disclaimer, the term of this patent is extended or adjusted under 35 U.S.C. 154(b) by 732 days.

(21) Appl. No.: 10/793,149

(22) Filed: Mar. 4, 2004

(65) Prior Publication Data

US 2004/0264612 A1 Dec. 30, 2004

Related U.S. Application Data

(60) Provisional application No. 60/451,799, filed on Mar. 4, 2003.

(51) Int. Cl.
*H04L 7/00* (2006.01)

(52) U.S. Cl. ...................................... 375/355

(58) Field of Classification Search ................ 375/354, 375/333, 365, 282, 361, 327, 225, 355; 368/113; 327/164; 348/500; 714/47, 25; 360/42
See application file for complete search history.

(56) References Cited

U.S. PATENT DOCUMENTS

| 4,072,958 A |   | 2/1978  | Hayami et al. |         |
|-------------|---|---------|---------------|---------|
| 4,196,451 A |   | 4/1980  | Pellar        |         |
| 4,361,895 A | * | 11/1982 | Khoudari      | 375/333 |
| 4,542,420 A | * | 9/1985  | Kozlik et al. | 360/42  |
| 4,592,072 A | * | 5/1986  | Stewart       | 375/282 |
| 4,595,992 A |   | 6/1986  | Drogin        |         |
| 4,677,648 A |   | 6/1987  | Zurfluh       |         |
| 4,837,677 A | * | 6/1989  | Burrus et al. | 710/308 |
| 4,875,201 A |   | 10/1989 | Dalzell       |         |
| 4,998,109 A |   | 3/1991  | LeChevalier   |         |
| 5,003,562 A | * | 3/1991  | van Driest et al. | 375/327 |
| 5,040,195 A | * | 8/1991  | Kosaka et al. | 375/365 |
| 5,043,596 A |   | 8/1991  | Masuda        |         |
| 5,087,829 A |   | 2/1992  | Ishibashi     |         |
| 5,109,283 A |   | 4/1992  | Carley        |         |
| 5,166,959 A |   | 11/1992 | Chu et al.    |         |
| 5,199,008 A |   | 3/1993  | Lockhart et al. |       |

(Continued)

FOREIGN PATENT DOCUMENTS

EP 0663745 7/1995

(Continued)

OTHER PUBLICATIONS

European Patent Office, Communication Pursuant to Article 96(2) EPC, dated Nov. 21, 2002, 5 pages.

(Continued)

*Primary Examiner*—Don N Vo
(74) *Attorney, Agent, or Firm*—Wilmer Cutler Pickering Hale & Dorr LLP

(57) ABSTRACT

A method and circuit for processing a serial data stream carrying data at a rate established by an underlying clock signal, the method and circuit involving: time-stamping each of the transitions of a sequence of transitions within the serial data stream to thereby generate a sequence of time stamps; and based at least in part on the sequence of time-stamps, recovering the data from the serial data stream.

17 Claims, 12 Drawing Sheets

U.S. PATENT DOCUMENTS

| | | | |
|---|---|---|---|
| 5,204,678 | A | 4/1993 | Foley |
| 5,450,136 | A * | 9/1995 | Cirineo .................. 348/500 |
| 5,537,069 | A | 7/1996 | Volk |
| 5,552,733 | A | 9/1996 | Lesmeister |
| 5,600,450 | A | 2/1997 | Kaye et al. |
| 5,684,760 | A | 11/1997 | Hunter |
| 5,699,337 | A | 12/1997 | Kobayashi et al. |
| 5,761,254 | A * | 6/1998 | Behrin ................... 375/355 |
| 5,790,610 | A * | 8/1998 | Julyan .................. 375/361 |
| 5,793,709 | A * | 8/1998 | Carley ................... 368/113 |
| 5,903,522 | A | 5/1999 | Carley |
| 6,025,745 | A | 2/2000 | Lee et al. |
| 6,046,822 | A | 4/2000 | Wen et al. |
| 6,195,768 | B1 * | 2/2001 | Green .................... 714/47 |
| 6,377,094 | B1 * | 4/2002 | Carley ................... 327/164 |
| 6,664,832 | B2 | 12/2003 | Carley |
| 6,680,970 | B1 * | 1/2004 | Mejia .................... 375/225 |
| 6,888,905 | B1 * | 5/2005 | Cheah et al. ............ 375/355 |
| 2001/0055258 | A1 | 12/2001 | Carson et al. |
| 2002/0163453 | A1 | 11/2002 | Van Dijk et al. |
| 2002/0188888 | A1 * | 12/2002 | Rivoir ................... 714/25 |
| 2002/0190760 | A1 | 12/2002 | Carley |
| 2004/0030946 | A1 | 2/2004 | Carley |
| 2004/0243957 | A1 | 12/2004 | Mandry |
| 2004/0264612 | A1 | 12/2004 | Allen |

FOREIGN PATENT DOCUMENTS

WO     WO 02/35529     5/2002

OTHER PUBLICATIONS

Patent Cooperation Treaty, International Search Report, dated Mar. 10, 2005, 2 pages.

* cited by examiner

FIG. 3A
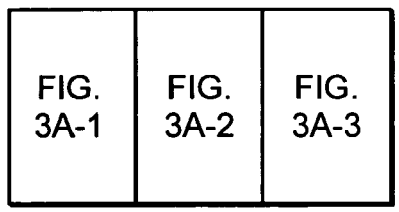
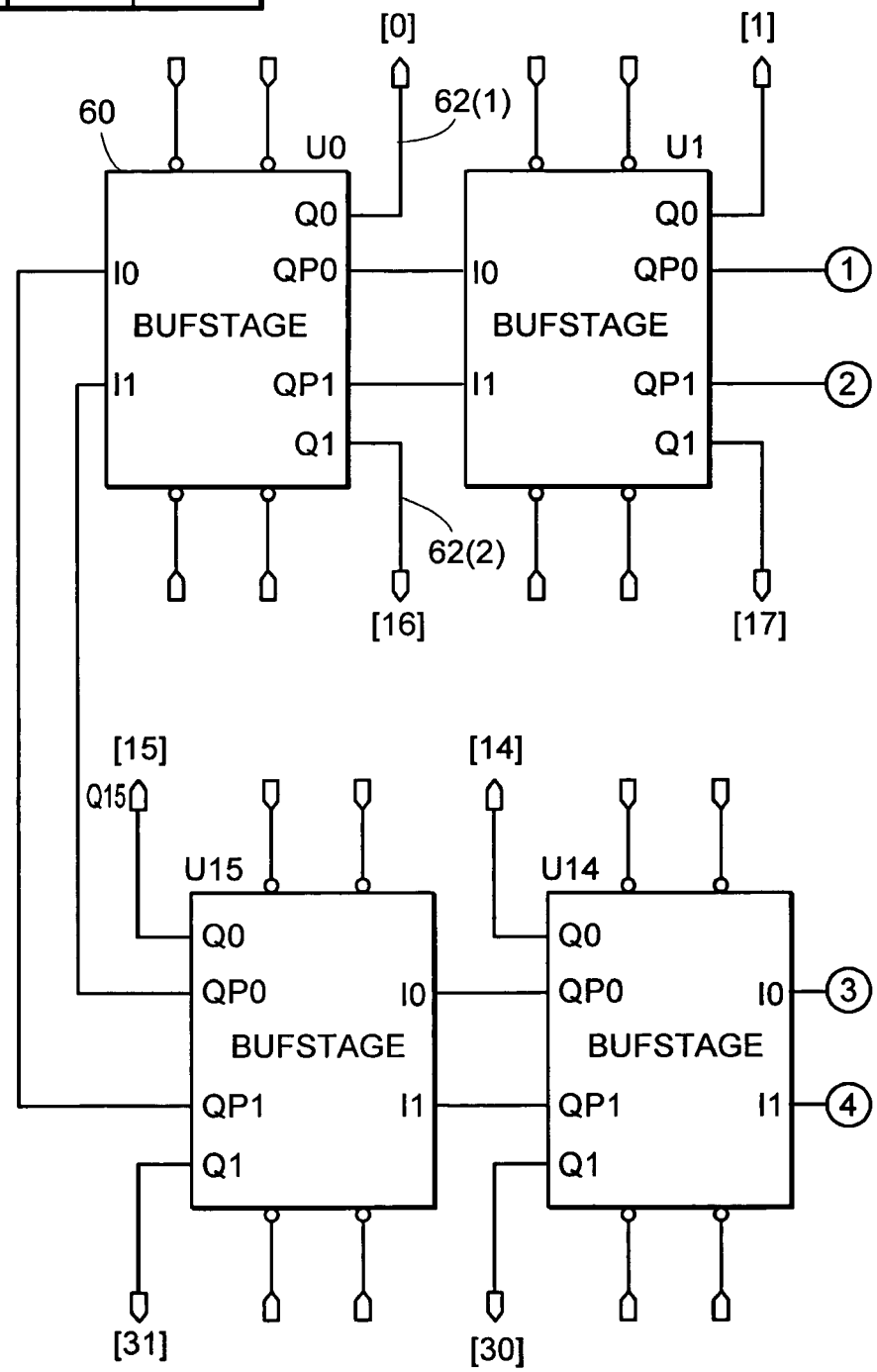
FIG. 3A-1

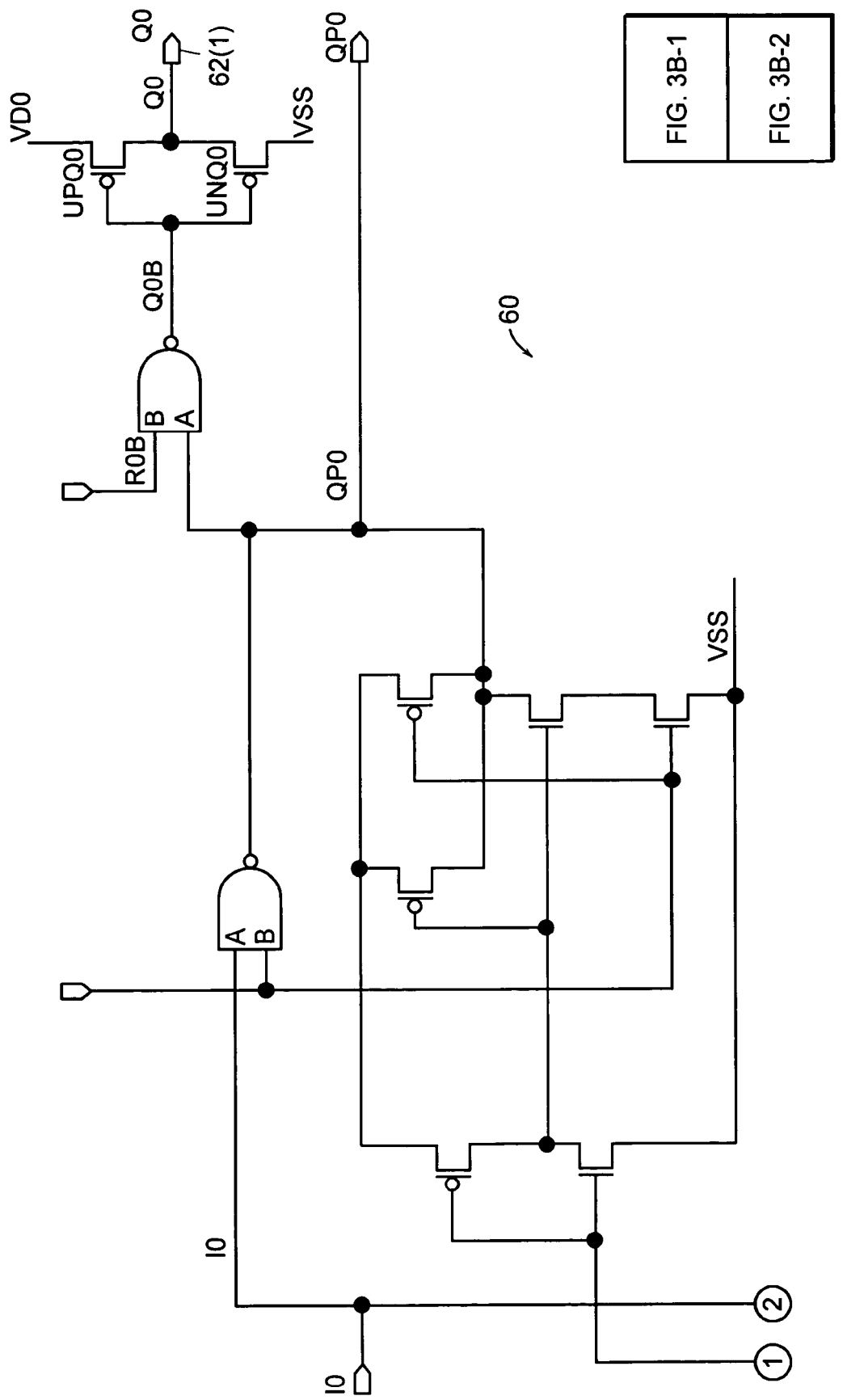

FIG. 5A (→100)

| | TAP 0 (+)(−) | TAP 1 (+)(−) | TAP 2 (+)(−) | TAP 3 (+)(−) | TAP 4 (+)(−) | TAP 5 (+)(−) | TAP 6 (+)(−) |
|---|---|---|---|---|---|---|---|
| OUTPUT | 0  1 | 1  0 | 0  1 | 1  0 | 1  0 | 0  1 | 1  0 |
| CAPTURE | 0  0 | 1  1 | 0  0 | 1  1 | 1  1 | 0  0 | 1  1 |
| MUX | 0 | 1 | 0 | 1 | 1 | 0 | 1 |
| XNOR | 0 | 0 | 0 | 1 | 0 | 0 | 1 |

FIG. 5B (→102)

| | TAP 0 (+)(−) | TAP 1 (+)(−) | TAP 2 (+)(−) | TAP 3 (+)(−) | TAP 4 (+)(−) | TAP 5 (+)(−) | TAP 6 (+)(−) |
|---|---|---|---|---|---|---|---|
| OUTPUT | 0  1 | 1  0 | 0  1 | 1  0 | 1  0 | 0  1 | 1  0 |
| CAPTURE | 0  0 | 1  1 | 0  0 | 1  1 | 0  0 | 0  0 | 1  1 |
| MUX | 0 | 1 | 0 | 1 | 0 | 0 | 1 |
| XNOR | 0 | 0 | 0 | 0 | 1 | 0 | 0 |

FIG. 5C (→103)

| | TAP 0 (+)(−) | TAP 1 (+)(−) | TAP 2 (+)(−) | TAP 3 (+)(−) | TAP 4 (+)(−) | TAP 5 (+)(−) | TAP 6 (+)(−) |
|---|---|---|---|---|---|---|---|
| OUTPUT | 0  1 | 1  0 | 0  1 | 1  0 | 1  0 | 0  1 | 1  0 |
| CAPTURE | 0  0 | 1  1 | 0  0 | 1  1 | 1  0 | 0  0 | 1  1 |
| MUX | 0 | 1 | 0 | 1 | 1 | 0 | 1 |
| XNOR | 0 | 0 | 0 | 1 | 0 | 0 | 0 |

CLOCK AND DATA RECOVERY METHOD AND APPARATUS

This application claims the benefit of U.S. Provisional Application No. 60/451,799, filed Mar. 4, 2003.

TECHNICAL FIELD

This invention relates to methods and apparatus for recovering clock and data information from a serial data stream.

BACKGROUND OF THE INVENTION

Electronics devices contain many interfaces which transfer data serially. Some examples are USB, Ethernet, Firewire and Rambus. These interfaces have high bit rates which must be captured reliably at the receiver. Most receivers generate a clock at the serial bit rate to sample the serial data before decoding. To do this they typically use a phase-locked loop (PLL) circuit to find the clock signal within the received serial data. Then, they clock the received serial data into a shift register using a synchronized clock which is at the serial bit rate but offset in phase from the serial data transitions so as to sample the serial data when it is stable. Sampled serial data above a preselected threshold value is a one and sampled serial data that is below that threshold value is a zero.

This method works well at low bit frequencies, such as less than 100 MHz, since accumulated timing errors will still generate a clock edge near the correct time. At frequencies higher than 100 MHz, variation in the timing of the serial sampling clock, from process, temperature or voltage changes, can cause incorrect sampling of the data.

SUMMARY OF THE INVENTION

In general, in one aspect the invention features a method of processing a serial data stream carrying data at a rate established by an underlying clock signal. The method involves: time-stamping each of the transitions of a sequence of transitions within the serial data stream to thereby generate a sequence of time-stamps; and based at least in part on the sequence of time-stamps, recovering the data from the serial data stream.

Other embodiments include one or more of the following features. The method also involves generating a plurality of oscillatory signals that are the same frequency and are separated in phase by substantially equal amounts, and time-stamping of each of the transitions of the sequence of transitions within the serial data stream involves capturing the state of said plurality of oscillatory signals at the time of that transition. The method also includes supplying a reference clock signal; and time-stamping each of the transitions of a sequence of transitions within the reference clock signal to thereby generate a second sequence of time-stamps, wherein recovering the underlying clock signal and the data is based on both the first-mentioned sequence of time-stamps and the second sequence of time-stamps. The method additionally includes generating a plurality of oscillatory signals that are the same frequency and are separated in phase by substantially equal amounts, wherein time-stamping of each of the transitions of the sequence of transitions within the serial data stream involves capturing the state of said plurality of oscillatory signals at the time of that transition. Also, time-stamping of each of the transitions of the sequence of transitions within the reference clock involves capturing the state of said plurality of oscillatory signals at the time of that transition. The method further includes generating a lap count which is a count of the number of times that a particular one of the plurality of oscillatory signal has gone through a complete cycle. The capturing of the state of the plurality of oscillatory signals at each of the transitions of the sequence of transitions within the serial data stream involves capturing the value of each of the plurality of oscillatory signals and the lap count at the time of that transition.

Further features found in other embodiments also include the following. The method also includes parallelizing the recovered data from the serial data stream. The parallelizing of the recovered data from the serial data stream involves clocking the recovered serial data into a shift register and outputting the clocked-in recovered data in parallel in groups of n bits where n is an integer greater than one. The recovering of the data from the serial data steam involves, based at least in part on the sequence of time-stamps for the sequence of transitions within the serial data stream, synthesizing the underlying clock signal and using the synthesized clock signal to recover the data from the serial data stream.

In general, in another aspect, the invention features a circuit for processing a serial data stream carrying data at a rate established by an underlying clock signal. The circuit includes: a free-running loop oscillator; a serial data stream capture module which during operation receives the serial data stream and for each of the transitions of the sequence of transitions captures a corresponding state of the free-running loop oscillator as a time-stamp of that transition; and a data recovery module which during operation recovers the data within the serial data steam based, at least in part, on the captured state for the sequence of transitions, said data recovery module including a processor component which analyzes the captured state for the sequence of transitions.

Other embodiments include one or more of the following features. The circuit also includes a reference clock capture module which during operation receives a reference clock that is a sequence of reference clock transitions and which for each of the reference clock transitions of the sequence of reference clock transitions captures a state of the free-running loop oscillator, wherein the processing module uses the captured state for the sequence of reference clock transitions along with the captured state for the sequence of transitions within the serial data stream to recover the data within the serial data stream. The data recovery module also includes a shift register arranged to receive the serial data stream and output parallel data, and a clock generator that generates a synthesized clock for the shift register in response to instructions received from the processor component. The circuit further includes a synthesized clock capture module which during operation receives the synthesized clock and for each of the transitions of the sequence of synthesized clock transitions captures a state of the free-running loop oscillator, wherein the data recovery module uses the captured state for the sequence of synthesized clock transitions to correct for undesired changes in the synthesized clock. The data recovery module additionally includes a second shift register arranged to receive a second the serial data stream and output corresponding parallel data, and a delay element which introduces a predetermined phase shift into the synthesized clock and provides the phase-shifted synthesized clock to the second shift register. The free-running loop oscillator includes a plurality of buffer stages connected in series to form a loop, wherein each of the buffer stages of the plurality of buffer stages introduces a substantially equal amount of delay into a signal which circulates around the loop when it is oscillating; and the oscillator also includes a plurality of taps each of which is associated with a different one of the buffer stages and outputs a signal that indicates the state of that buffer.

The details of one or more embodiments of the invention are set forth in the accompanying drawings and the description below. Other features, objects, and advantages of the invention will be apparent from the description and drawings, and from the claims.

BRIEF DESCRIPTION OF THE DRAWINGS

FIGS. 5A-C illustrate the operation of the capture module shown in FIG. 3.

Note that the same reference numbers are used in different drawings to indicate that the identified components are the same or similar.

DETAILED DESCRIPTION

Two approaches to receiving high-speed serial data are described. Both approaches employ the free-running loop (FRL) technology described in U.S. Pat. No. 6,377,094, issued Apr. 23, 2002, entitled "Arbitrary Waveform Synthesizer Using a Free Running Oscillator," and in U.S. Pat. No. 5,793,709, issued Aug. 11, 1998, entitled "Free Loop Interval Timer and Modulator," both of which are incorporated herein by reference. The first approach that uses the FRL technology identified in the previously mentioned patents generates a sampling clock. The second approach that also uses the identified free-running loop technology, time-stamps transitions in the serial data and then decodes the data from the time-stamps. Both of the approaches can be extended to receive multiple simultaneous serial signals such as are used in PCIexpress.

A Clock and Data Recovery Circuit: Overview

Figure 1:
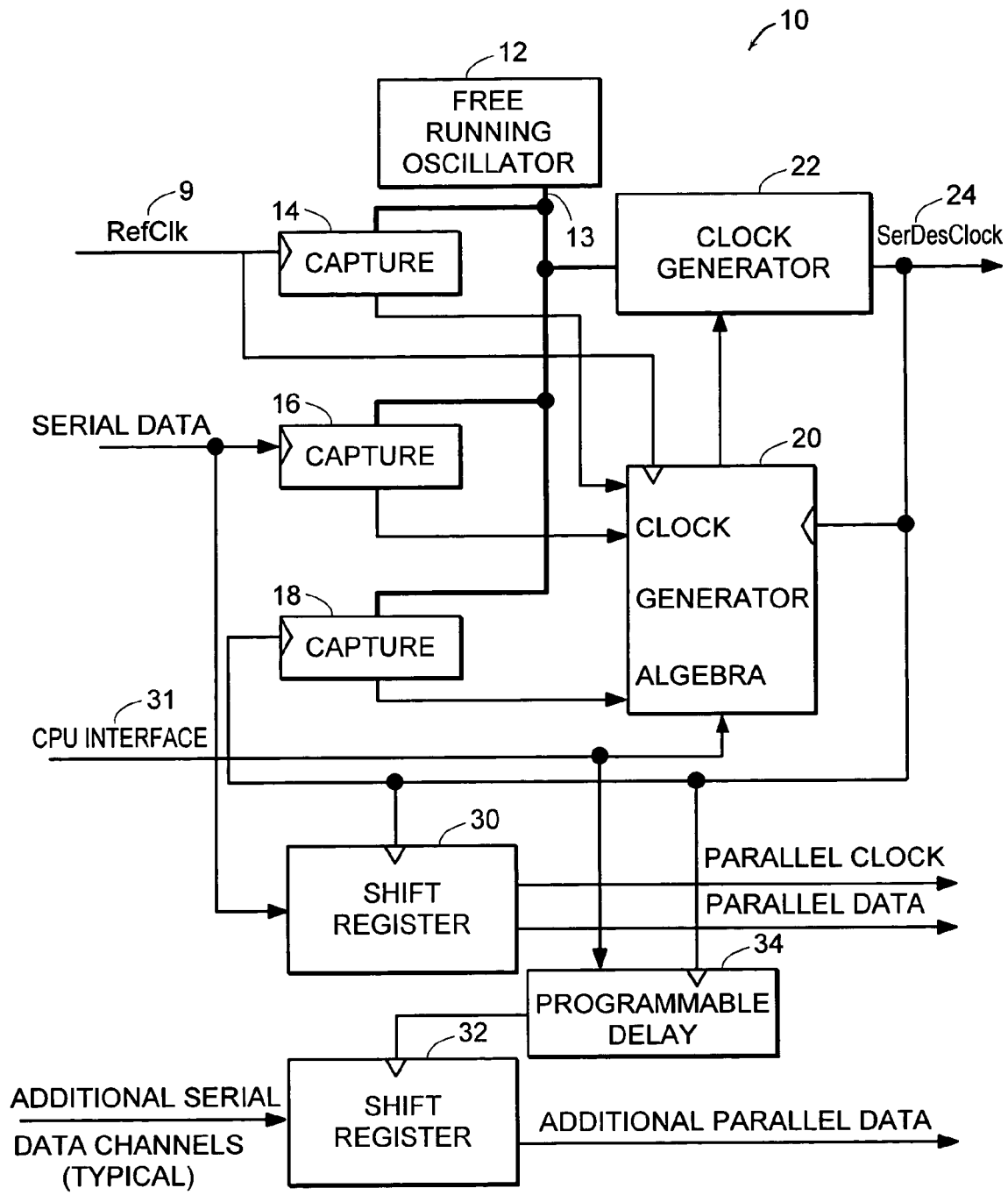
FIG. 1 is a block diagram of a clock and data recovery circuit that uses a free-running loop oscillator.

Referring to FIG. 1, a first embodiment of a clock and data recovery circuit 10 includes a free-running loop oscillator 12 that generates an array of output signals 13 for time-stamping another signal and for generating a desired clock waveform. The free-running loop is a sequence of buffers connected in series with output taps between the buffers. The buffers function as delay elements which introduce an unknown but small amount of delay in a transition signal passing through each buffer. The buffers are connected in a closed loop so a transition signal (or change of state) that is propagating through the sequence of buffers feeds back to the beginning of the loop causing the transition signal to circulate continually around the loop. The free-running loop also includes a counter that keeps track of how many times the transition signal has made a complete circuit around the loop. So, at any point in time, the state of the buffers within the loop indicates the location of the transition signal. That location plus the lap count indicates how far the signal has traveled since the last time the state of the free-running loop was measured. Thus, the lap count plus the state of the buffers, which is obtainable by reading the signals on the taps, provides a convenient measure of time. Time-stamping involves capturing that information upon the occurrence of an event, such as a transition of a clock signal or data signal, to mark when that event occurred.

Clock and data recovery circuit 10 includes three capture modules 14, 16 and 18, each of which receives the output signal from free-running loop 12 (i.e., the signals on the array of taps plus the lap counter). Each capture module 14, 16, and 18 responds to a different input signal received over an associated input line. The input signals are the signals that are to be time-stamped by the capture module. Each time the respective input signal undergoes a transition that causes the capture module to capture the state of the free-running loop as a time-stamp of that transition. So, in response to receiving a sequence of transitions, the capture module outputs a stream of time-stamps for the transitions within that sequence.

Each of capture modules 14, 16 and 18 delivers its generated sequence of time-stamps to a clock generator algebra module 20. In general, clock generator algebra module 20, which is a programmed processing-based module (e.g. state machine or microprocessor), analyzes the multiple received streams of time-stamps so as to identify the clock signal within the serial data stream and then it causes a clock generator 22 to generate a clock signal 24 that is synchronized with the serial data stream. It also uses the received time stamps to monitor the stability of the generated clock signal 24 and to change the generated clock signal to compensate for changes in performance of clock generator 22 due to changes in supply voltages, temperature, and other environmental parameters.

Capture module 14 provides information for calibrating the free-running clock. It receives as its input a stable reference clock 9, the period of which is precisely known. In response to the reference clock, capture module 14 generates a stream of time-stamps from which the time spacing between the taps on the free-running loop can be accurately computed by a loop-averaging module 15 (not shown) within clock generator algebra module 20. In essence, loop averaging module 15 takes time-stamps for two successive positive transitions in the reference signal, computes the difference of those two time-stamps, and divides the computed difference into the known period of the reference clock. The result is an accurate measure of the spacing between the taps in terms of the time it takes for the transition to move from one tap to the next tap (i.e., time per tap).

Alternatively, the computation of the spacing of the taps can be avoided if the user knows the frequency of the clock that needs to be synthesized and provides that information to the algebra module. Thus, the number of taps that separate the transitions in the synthesized clock can be simply specified as the number of taps separating transitions in the reference clock times the ratio of the frequency of the synthesized clock to the frequency of the reference clock. If that ratio proves not to be precisely accurate, the algebra module can make appropriate adjustments during operation.

Capture module 16 provides information about the serial data stream for which clock and data recovery is being performed. More precisely, it time-stamps the detected transitions in the serial data signal. Clock generator algebra module 20 then uses this information, along with the input from capture module 14, to compute the timing of the transitions that would be required to construct a synthesized clock signal that is synchronized with the clock signal within the serial data stream and appropriately phase-shifted so as to accurately sample the data within the serial data stream. Based on the computed timing information, algebra module 20 causes clock generator 22 to select the appropriate transitions being output by free-running loop 12 and thereby construct synthesized clock 24 for the serial data stream.

This synthesized clock 24 is supplied to a shift register 30 where it clocks the data from the serial data stream into the register. Shift register 30 outputs the stored data as parallel data (i.e., groups of n bits wherein n might be 2, 4, 8, 16, or more bits) and also provides a parallel clock signal for that data.

With the synthesized clock there may be temperature and voltage variability that cannot be known in advance. This variability might be due to changes in the performance of the circuits as a result of changes in those parameters (i.e., changes in temperature and voltage). Because such variability typically cannot be predicted in advance, algebra module 20 cannot pre-compute compensation for it. So, to eliminate timing errors caused by such changes, capture module 18 time-stamps the synthesized clock and provides that information to algebra module 20. By comparing these time-stamps with the expected timing of the synthesized clock, algebra module 20 detects timing variations and adjusts the control of clock generator 22 accordingly. That is, algebra module 20 "knows" when the transitions should have occurred and makes adjustments in the control signals that are sent to clock generator 22 to assure that they occur when they should. By this technique, the circuit is able to tune out the effects of temperature and voltage changes on the performance of the circuits on the back end.

There is also a CPU interface 31 provided for controlling the processing, clock generation, and filtering in the algebra block as well as for setting the programmable delay in the programmable delay unit, which is discussed later.

The modules that were introduced above will now be described in greater detail starting with the free-running loop oscillator.

The Free-Running Loop Oscillator

Figure 2:
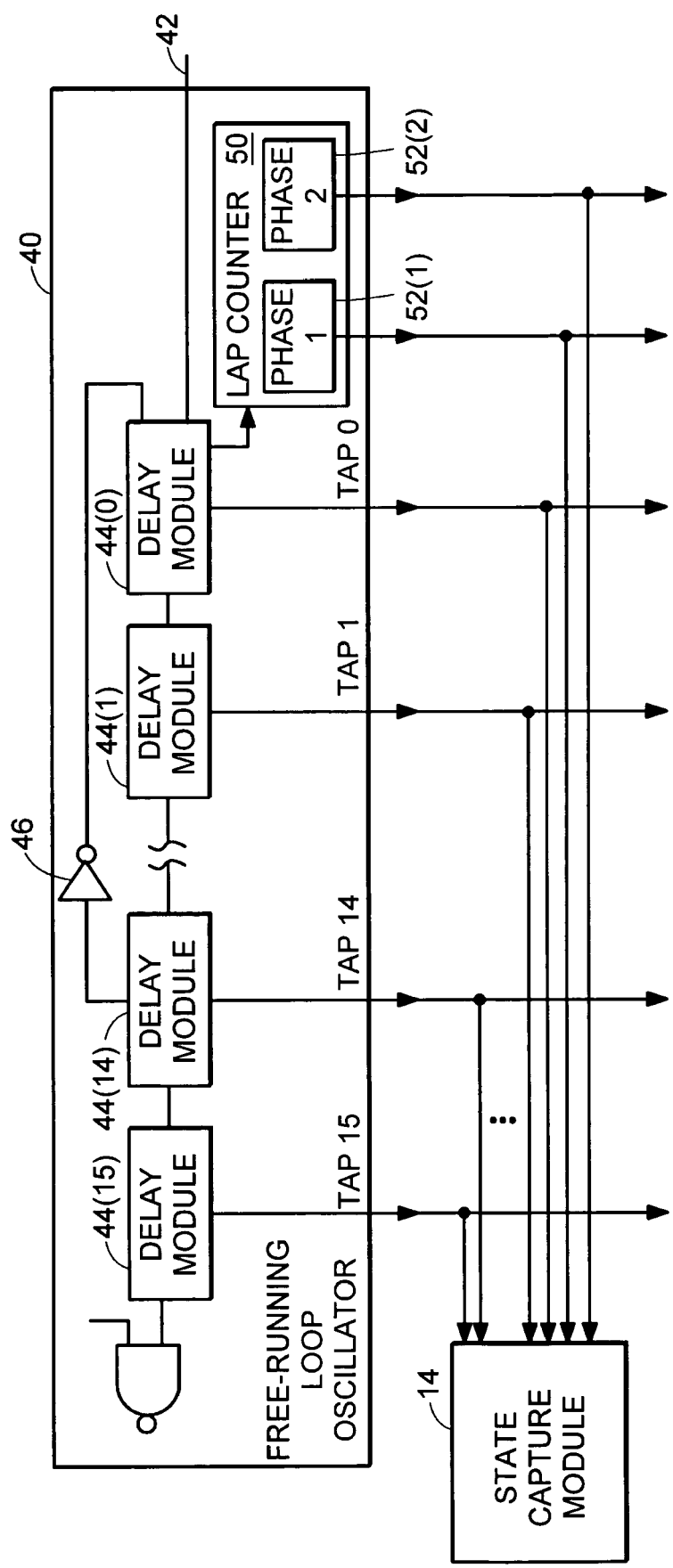
FIG. 2 is a schematic diagram of a free-running loop oscillator.

The basic principles of operation of the free-running loop oscillator can be understood with the aid of FIG. 2, which illustrates a simplified implementation of a free-running loop oscillator. Free-running loop oscillator 40 includes an input 42 for an external reset signal, a series of delay modules or buffers 44(0), 44(1), . . . 44(14), and 44(15) (referred to generally as 44) and at least one inverting element 46. In this example, the delay modules are of the non-inverting type so a positive transition at the input causes a position transition at the output. The reset signal has two states, namely, a reset state and a run state. While the reset signal is in the reset state, the loop does not oscillate. When the reset signal transitions to the run state, the loop begins to oscillate. A transition or change in state propagates through the first delay element module 44(0) to the input of the next delay element module 44(1). Shortly after a signal is received at the input of a delay element module, the signal is output on the corresponding tap 0.

The transition continues to propagate to the next delay element module 44(1) where it next appears on tap 1. This continues as the transition passes through each successive delay element module 44. By examining the outputs of the collection of taps at any point in time, one can tell where in the sequence the transition is located.

To create the "looping" effect, one transition is selected (e.g., from delay element module 44(14) and fed back through inverting element 46 to the input of the first delay element module 44(0). In this example, it is shown as connected between delay element modules 44(14) and 44(0), but other arrangements could be used. The object is to provide positive feedback that sustains oscillation in the loop.

The loop oscillator also includes a lap counter module 50. The lap counter module is electrically connected to first delay element module 44(0) for receiving transition edges as they propagate through delay element module 44(0). The lap counter module includes two counters, namely a positive edge counter 52(1) and a negative edge counter 52(2). Positive edge counter 52(1) counts one each time a positive edge transition (e.g. transition from logic low to high) propagates through delay element module 44(0). Negative edge counter 52(2) counts one each time a negative edge transition (e.g. transition from logic high to low) propagates through the delay element module 44(0). Thus, negative edge counter 52(2) is 180° out-of-phase with positive edge counter 52(1). Two counters are used to ensure that while one counter is being updated, other modules have access to another counter that is stable and accurate from which to determine the lap number.

It turns out that the propagation time for a positive transition is usually different from the propagation time for a negative transition. Thus, to produce more consistent propagation times around the loop it is useful to use a differential design of the type mentioned below and in which edges of both types are produced all of the time. The differential design includes an inverting element in each delay element module and provides differential outputs, one being a rising edge and the other being a falling edge. This approach also produces a more uniform loading on the power supply.

Also, note that the free-running loop oscillator can alternatively be viewed as generating 16 equally spaced phases of a lower frequency clock signal. Each phase is shifted from the preceding phase by an amount that is equal to the delay between the two taps of the free-running loop.

The Capture Modules

As noted above, the capture modules capture the outputs (i.e., the state) on the taps of the free-running loop oscillator when triggered to do so. Because detecting a rising edge often tends to produce slightly different results from detecting a falling edge, each delay element module in the described embodiment of the free-running loop oscillator is actually designed to produce both a rising edge output signal and a falling edge output signal in response to the circulating transition signal. That is, each delay element module has a differential pair of output lines for outputting both types of signals. This enables the capture module to always capture a rising edge by appropriately selecting the correct line of the differential pair at each delay element module.

Figures 2, 3A:
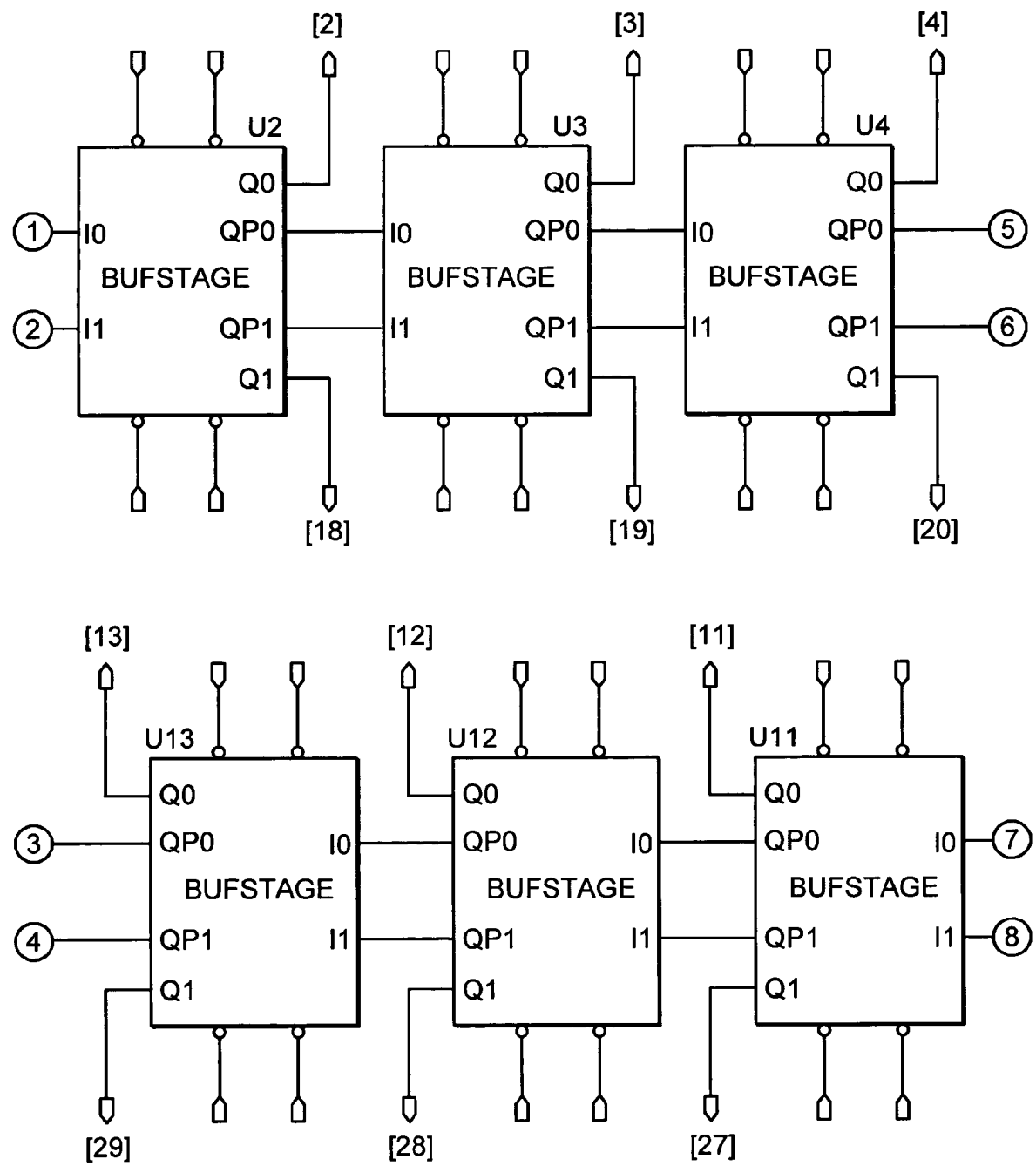
FIG. 3A is a more detailed circuit diagram of the free-running loop that provides the differential tap signals to the capture module of FIG. 3.
Figures 3, 3A:
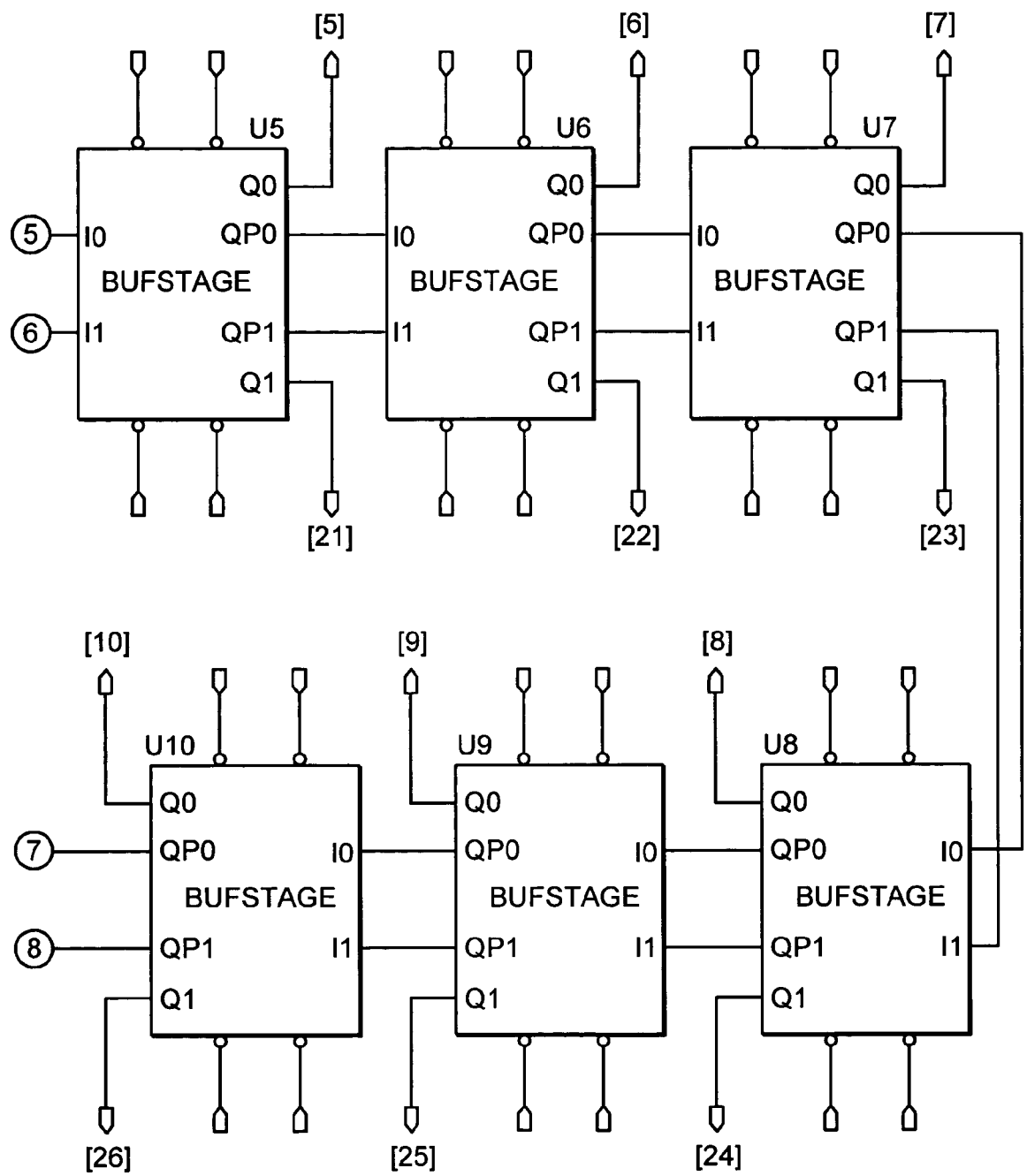
Figures 2, 3B:
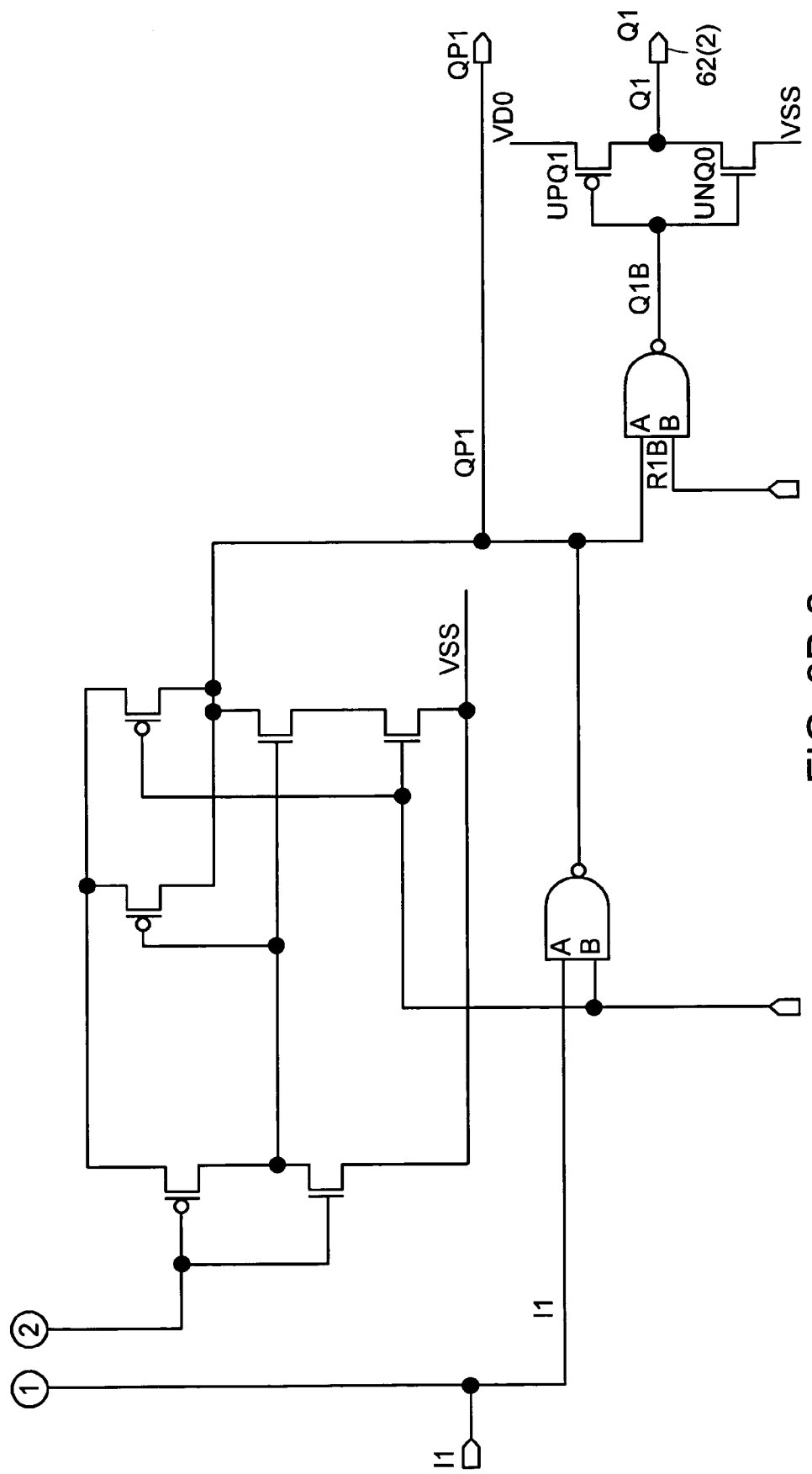
FIG. 3B is a circuit diagram of a buffer stage that is used in the circuit of FIG. 3A.
Figure 3C:
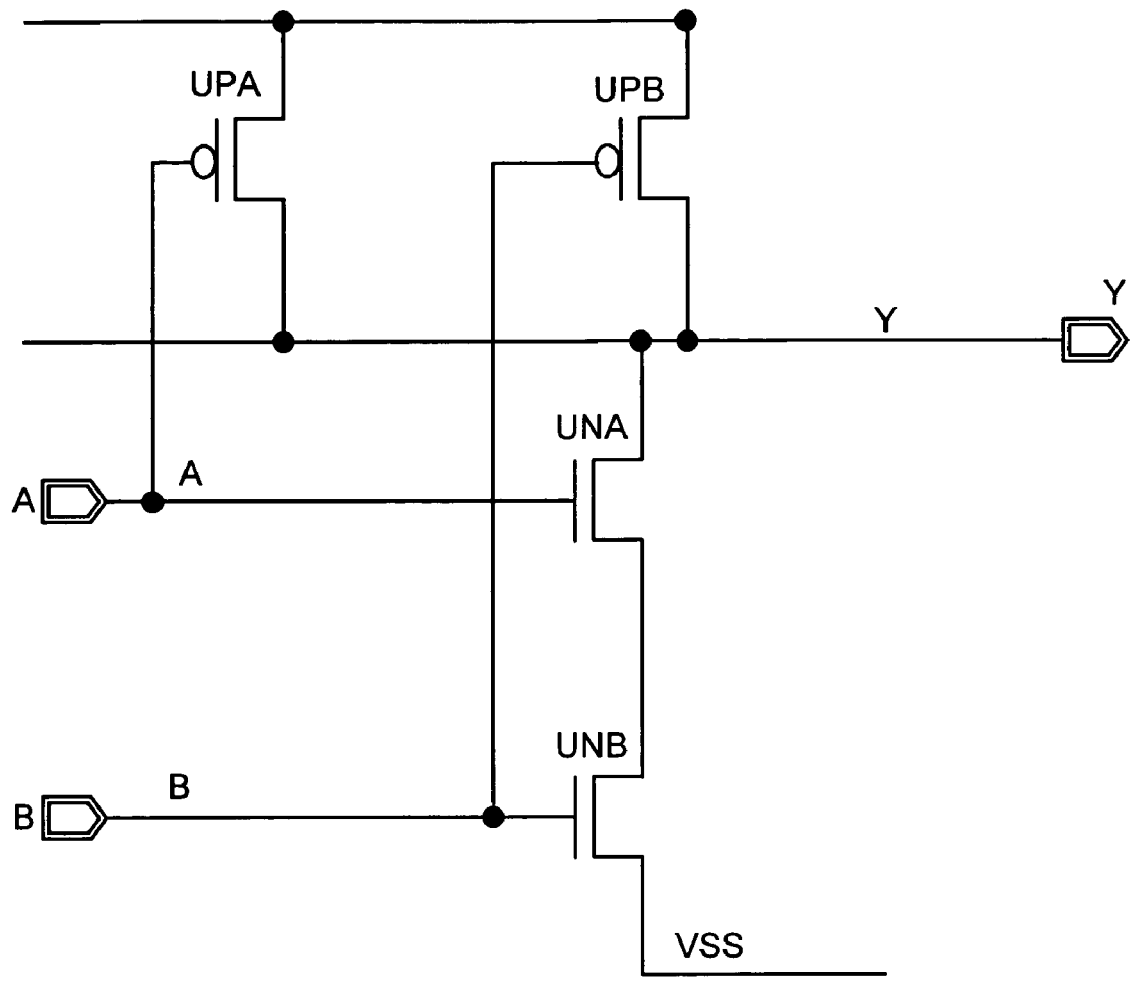
FIG. 3C is a circuit diagram of the NAND gate that is used in the buffer stage of FIG. 3B.

Referring to FIG. 3A, the free-running loop oscillator that has differential outputs includes 16 buffer stages 60 connected in a loop. Each buffer stage includes two outputs 62(1) and 62(2) which make up the differential output pair for that stage. The internal design of the buffer stage is shown in FIG. 3B using conventional symbols for the circuit elements. The internal structure of the NAND gates is shown in FIG. 3C. Note that in the free-running loop oscillator shown in FIGS. 3A-C, the edge must go through loop twice before the loop arrives back to the same condition.

The free-running loop oscillator has sixteen delay taps, each of which is spaced from the last one by a similar amount of delay. There are sixteen outputs labeled [0] . . . [15], each of which is separated from the last one by an inversion. A transition passing through the loop circuit that first appears as a rising edge on line [0] will next appear as a falling edge on line [1] and then again as a rising edge on line [2], etc. There are another sixteen outputs labeled [16] . . . [31] which output the complements of the corresponding signals on the first sixteen lines [0] . . . [15]. That is, outputs [N] and [N+16], wherein N=0 . . . 15, form differential pairs with the signal on output [N+16] being the complement of the signal on output [N]. Thus, by using the appropriately designed capture circuitry, it is possible to always detect the state of the loop by monitoring rising edge signals and thereby avoid introducing possible errors into the measurements caused by alternating between monitoring rising edge signals and falling edge signals.

In general, each capture module includes a register that uses the input signal as its clock. Upon a transition of the input (typically a positive edge transition), the register stores or "captures" the state of the free-running loop oscillator. In the described embodiment, the register stores a 16-bit data word of which 11 bits are used for the value of the lap counter and four bits are used to represent the 16 taps. These four bits are used for the state of the taps, representing the last tap that the transition propagated through at the time of the capture. One bit is used to represent the state of the transition (i.e., positive edge or negative edge) as it passed through the first delay element module. That bit is indicates whether the transition edge selected by the algebra module is a positive edge or a negative edge and needs to be inverted by the switching module when constructing the synchronized clock.

Figures 1, 4A:
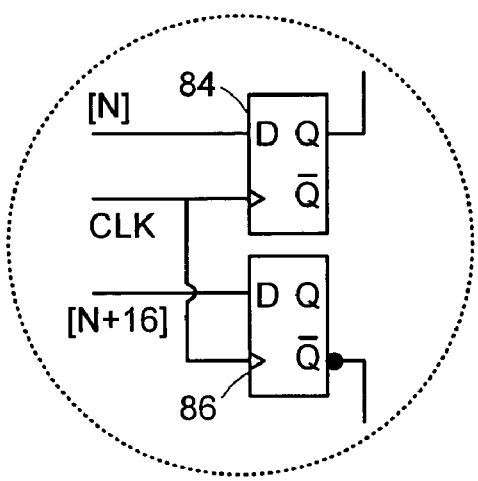
Figure 4A:
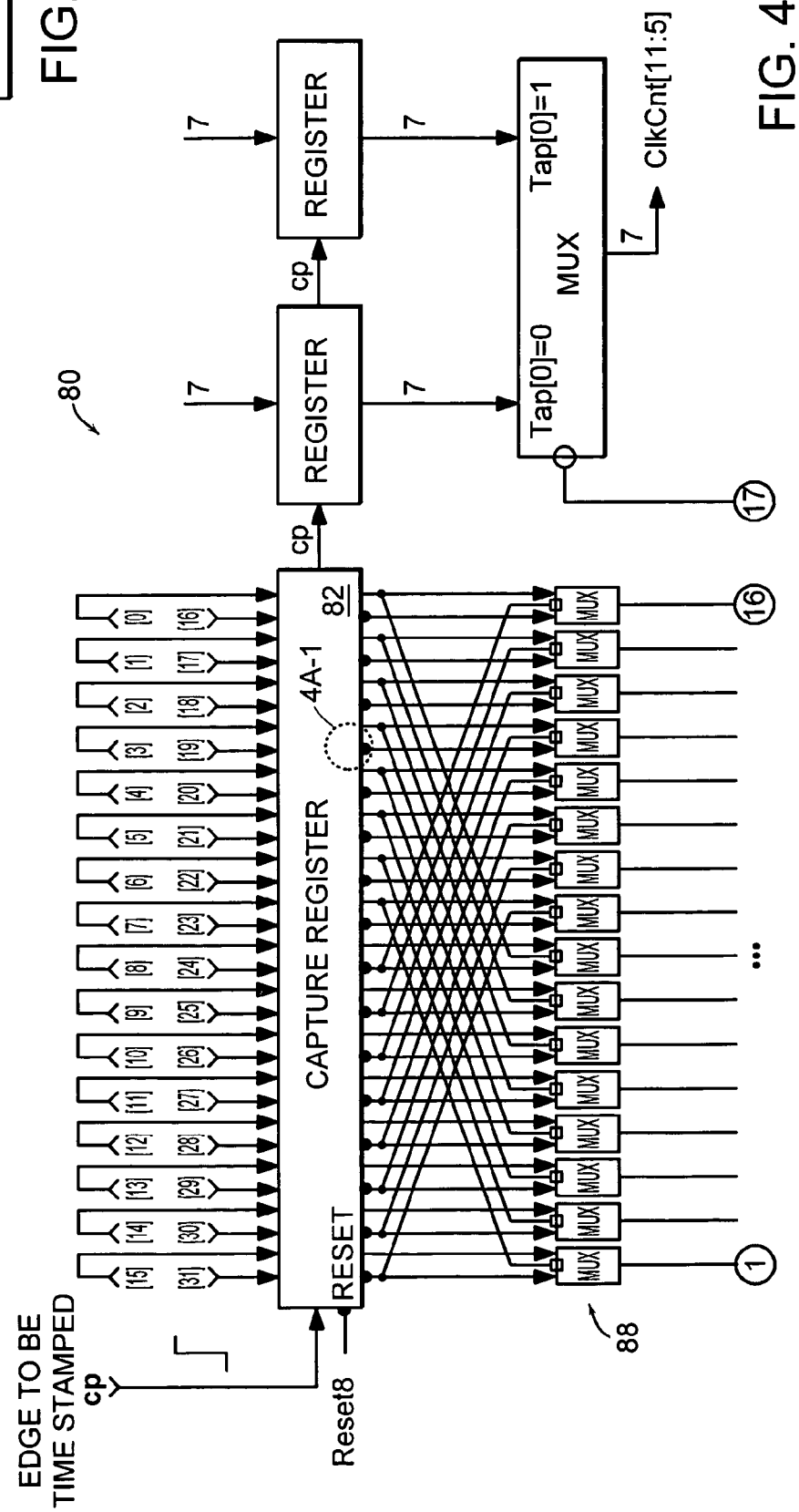
FIG. 4 is a circuit diagram of the capture module.
Figure 4B:
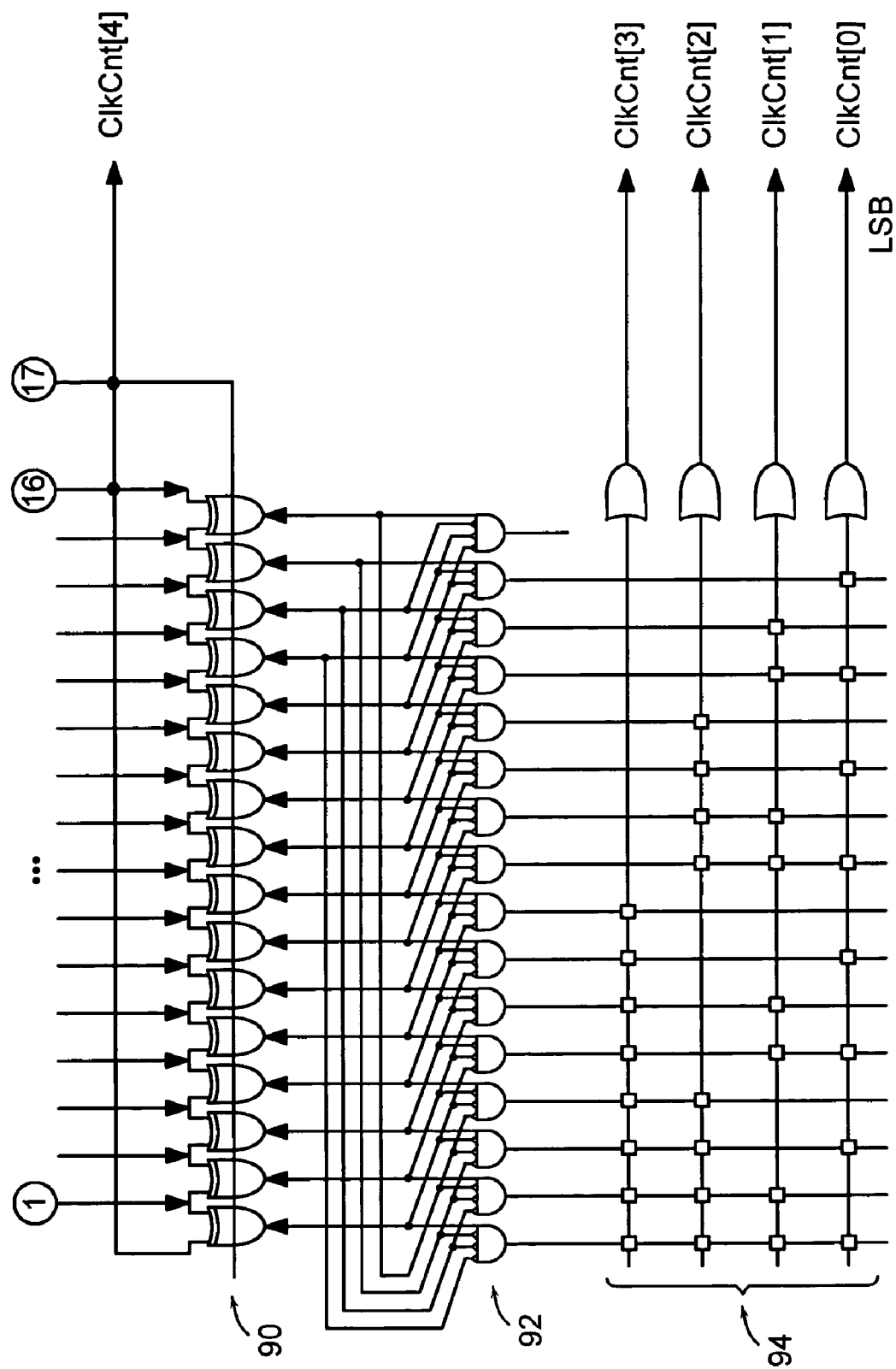

A more detailed schematic of the design of a capture module 80 that is used with the differential outputs of the free-running loop oscillator is shown in FIG. 4. Capture module 80 includes a capture register 82 made up of an array of D flip-flops to capture the signals on the differential output lines of the free-running loop oscillator. The array includes 16 D flip-flops 84 from which the non-inverted signal is selected as its output and 16 D flip-flops 86 from which the inverting output signal is selected as its output. Each of the 16 non-inverting D flip-flops receives its signal from a corresponding different one of the sixteen outputs [0] . . . [15] and each of the inverting D flip-flops receives its signal from a corresponding different one of the sixteen outputs [16] . . . [31]. For each differential pair of lines coming into the capture register, there is a corresponding pair of output lines from the capture register. Note that if the signals on a differential pair of lines are settled and stable when the capture occurs, the two outputs from the capture register corresponding to that differential pair will carry the same value.

To select the appropriate signals on the outputs of the two arrays of D flip-flops, there is an array of 16 make-before-break MUXes 88, each receiving input from a different corresponding pair of output lines form the capture register. These MUXes are controlled so as to always select the rising edge signal as the signal from which to determine the state of the free-running oscillator whenever the two output signals from the capture register are not the same. As a rule, the two input signals to a MUX will in fact be the same. At locations away from the edge within the free-running oscillator, the output signals from the oscillator will be settled and stable and the MUXes will capture them cleanly. So, at those locations along the free-running loop, it does not matter which input signal to the MUX is selected as the output signal. However, this might not be the case near an edge within the free-running loop. Because of the difference between detecting rising edges versus detecting falling edges and because of other instabilities during transitions, it is possible that the two input signals to the MUX monitoring that location of the loop will be different. So, the select line to the MUX looks ahead at signal that is half way around the loop to determine which input signal to select. The rationale is that the control signal that is half way around the loop will be stable and thus can be used to accurately determine which signal to that MUX is the rising edge signal.

The outputs of MUXes 88 provide inputs to an array of XNOR gates 90. Each XNOR gate of the array looks at the output signals from two neighboring MUXes. In essence, the array of XNOR gates in combination with the array of MUXes detect where the edge is within the free-running loop at the moment that the time-stamp is captured.

How this circuitry works can be understood with the aid of the charts shown in FIGS. 5A-C. These charts show the signals at the differential outputs for taps 0 through 6 of the free-running loop and at the outputs of the D flip-flops, the MUXes, and the XNOR gates which capture and process those output signals.

FIG. 5A shows the output signals for taps 0 through 6 of the free-running loop oscillator after a transition has passed tap 3 and before it reaches tap 4 (see location 100). The two values in the row labeled "Output" represent the signals on the differential pair of lines for that tap. So, for example, the signal at output [0] of tap 0 is "0" and the signal at output [16] of tap 0 (i.e., the other output of the differential pair for the first delay element module) is "1." As one can see, the pattern of output signals alternates between 0-1 and 1-0 as one moves along the taps until one gets to tap 4. Since the transition has not reached tap 4, the pattern on its outputs is the same as the pattern the outputs of tap 3. But from that point on, the pattern again alternates.

In the example illustrate by FIG. 5A, the D flip-flops are clocked when the transition is at location 100 in the loop. For each pair of D flip-flops associated with a particular tap, the output signals are the same, either 1 1 or 0 0. And as one moves from one pair of D flip-flops to the next their output values alternate between 0 0 and to 1 1 until one reaches tap 4 at which the outputs of the pair of D flip-flops is the same as for the pair at the immediately preceding tap 3. Again, this follows because the transition has not yet reached tap 4.

Since both inputs to each MUXes are the same, the MUX outputs either one of those values. And the XNOR gates detect when the outputs of two neighboring MUXes are the same. In this example, that occurs for taps 3 for which the associated XNOR gate outputs a 1, indicating that the transition was at that pointing in the free-running the loop oscillator when the state f the loop was captured.

FIG. 5B shows the state of the captured outputs of the various elements after the transition has passed tap 4 but has not yet reached tap 5 (at location 102). The interpretation of the various signals is precisely as presented above in connection with FIG. 5A except that everything has advanced in time by an amount equal to the separation of the taps.

A more interesting example is presented in FIG. 5C. In this case, the transition is near tap 4 and it has affected one of the differential outputs but not the other. As noted above, this can happen because the response of the circuitry to a rising edge is often different from the response of a circuit to a falling edge (though maybe not by much). As a consequence, the outputs of the differential pair are the same (i.e., 1 1 instead of 0 1). The outputs of the pair of D flip-flops that capture those signals are different. The associated MUX selects one of these signals based on the value of the inverting D flip-flop in the capture register eight taps ahead of the current tap. This is arranged so that the signal for the rising edge is selected, which in this case is the 0 value. In general, anytime such a condition occurs at tap, the sampled signal from the tap that is in front of the tap at which the ambiguity exists will tell the MUX which value is for the rising edge value.

The outputs of the array of XNOR gates 90 are processed by debouncer logic 92 of a type that is known among persons of ordinary skill in the art. Slight differences among the D flip-flops and paths can cause "bounce", the edge appearing to be at three (or five, in extreme cases) nearby places in the loop. This is corrected by the debouncer logic which solves the problem and picks the first edge as the "real" one.

The output signals of debouncer logic 92 are then decoded by a convert-to-element count circuit 94 to generate a binary representation of the time-stamp which is in units of delay elements.

Clock Generator Algebra Module

Clock generator algebra module 20 is a data processing module which is implemented by one or more programmed digital processors. Algebra module 20 receives the external reference clock signal 9 and the sequences of time-stamps from capture modules 14, 16, and 18. Using these inputs, clock generator algebra module 20, based on programmed settings, analyzes the streams and computes what the frequency and phase of the synthesized clock should to be. It also calculates which of the transitions that will be generated by the free-running loop oscillator will need to be selected (by lap and tap location) to construct the synthesized clock. And it computes what changes need to be made to the selection of transition edges to compensate for drift and other changes within the generator module and other internal components. To perform all of these computations, it uses techniques known to persons of ordinary skill in the art.

In the described embodiment, algebra module 20 has four channels for calculating the next two rising edges and the corresponding falling edges of the synchronized clock. By calculating four edges in parallel, algebra module 20 can operate at a faster frequency, thus allowing the output signal to be a higher frequency. Of course, more channels can be sued based upon the computational requirements of the particular application.

Indeed, given the amount of computation that algebra module 20 needs to perform to analyze the three sequences of time-stamps that it receives from capture modules 14, 16, and 18, throughput could become an issue at higher clock speeds. To handle the higher computational loads, one could more processing power in the form of a multiple processor architecture in which the computational tasks can be distributed among the multiple processors and performed in parallel. Alternatively, since not all of the time stamps from the derail data stream are needed to perform the computations that are required, one could simply ignore some of the time-stamps for the serial data stream (e.g. take every $n^{th}$).

The methods described above work well for serial data streams that have little noise or jitter on the data transitions. However, many data streams to which these techniques could be applied have considerable noise and jitter. Two good examples are the serial data streams produced from reading optical data or from RF communications applications. For such applications, it will be necessary to perform some filtering of the received data to reduce the negative effects of these signal quality problems. Some of this filtering, e.g. averaging the errors between the serial time-stamps and the expected time-stamps, can be performed by clock generator algebra module 20. Filtering at this stage would also help more accurately capture loop speed versus the reference clock.

Clock Generator Module

Clock generator module 22 includes an internal switching module (not shown) to which the taps of the free-running loop are connected. It operates as described in U.S. Pat. No. 6,377, 094, mentioned above. In general, algebra module 20 transmits to clock generator module 22 the calculated transition edges that need to be used to generate the synthesized clock. This transmitted information from algebra module 20 controls the operation of the internal switching module, causing it to correctly select the taps of the free-running loop oscillator to construct the synthesized clock.

Additional Circuitry

Sometimes, a sender will transmit multiple lanes of serial data, all of which need to be received and sampled. Typically, when the multiple lanes of serial data come from the same sender, they all use the same clock, except that it might be phase-shifted by some predetermined different amount for each lane. If the phase shift information can be communicated to the receiver or derived in some way, then the above-described method and circuitry can be easily extended to receive the multiple lanes of serial data by simply adding an appropriate number of shift registers 32 and programmable delay units 34. Programmable delay unit 34 receives a copy of the synthesized clock from clock generator 22, phase shifts it by the required amount, and supplies it to shift register 32 to clock in the serial data from the corresponding lane.

On the other hand, if the clocks for the other lanes are not the same or the phase shifts are not known or readily determined, then one can simply use the approach described above to recover the clock and sample the received data for each channel individually. This means replicating capture modules 16 and 18 and clock generator 22 for each additional lane of serial data that is to be received.

There is other circuitry that would be included in a complete system for receiving and sampling a serial data stream. That additional circuitry is well known to persons of ordinary skill in the art and so will not be discussed here except to point out only a few of the more relevant components.

For example, there is a circuitry that sits in front of the clock and data recovery circuit and processes the received signal before it is passed to the clock and data recovery circuit. Typically, the received signal that might, for example, come over a cable is very low voltage and does not have enough swing to clock the flip-flops in the capture circuits. So, it needs to be amplified. In addition, it is usually transmitted in another form, e.g. as a differential signal, to make it more compatible for the medium over which it is being transmitted. That forms needs to be changed to a standard binary form. The front-end circuitry is usually an analog interface that does some of this processing. It converts the received signal from its transmitted form to a standard binary form having a clean wave shape with sufficient voltage swing for the downstream circuitry. It also includes ESD (electrostatic discharge) protection circuitry, automatic gain and offset control circuitry, and prefiltering circuitry.

Typically, there will also be backend circuitry that follows the clock and data recovery circuit and provides feedback control to correct for detected errors in the binary bit stream. For example, the analog circuit in the front end that decides which sampled signals are ones and which are zeros may have an undesired offset that causes errors in that process. In many systems, the binary data is transmitted in a form in which the number of ones and the number of zeros within a certain period of time are equal. If the back-end circuitry detects that they are not appearing in equal numbers, that may indicate an offset error in the front-end circuitry. So, the back-end circuitry adjusts the offset that is used to correct this problem. It might also detect other patterns in the sampled data that suggest other automatic adjustments need to be made.

Another Clock and Data Recovery System

Figure 6:
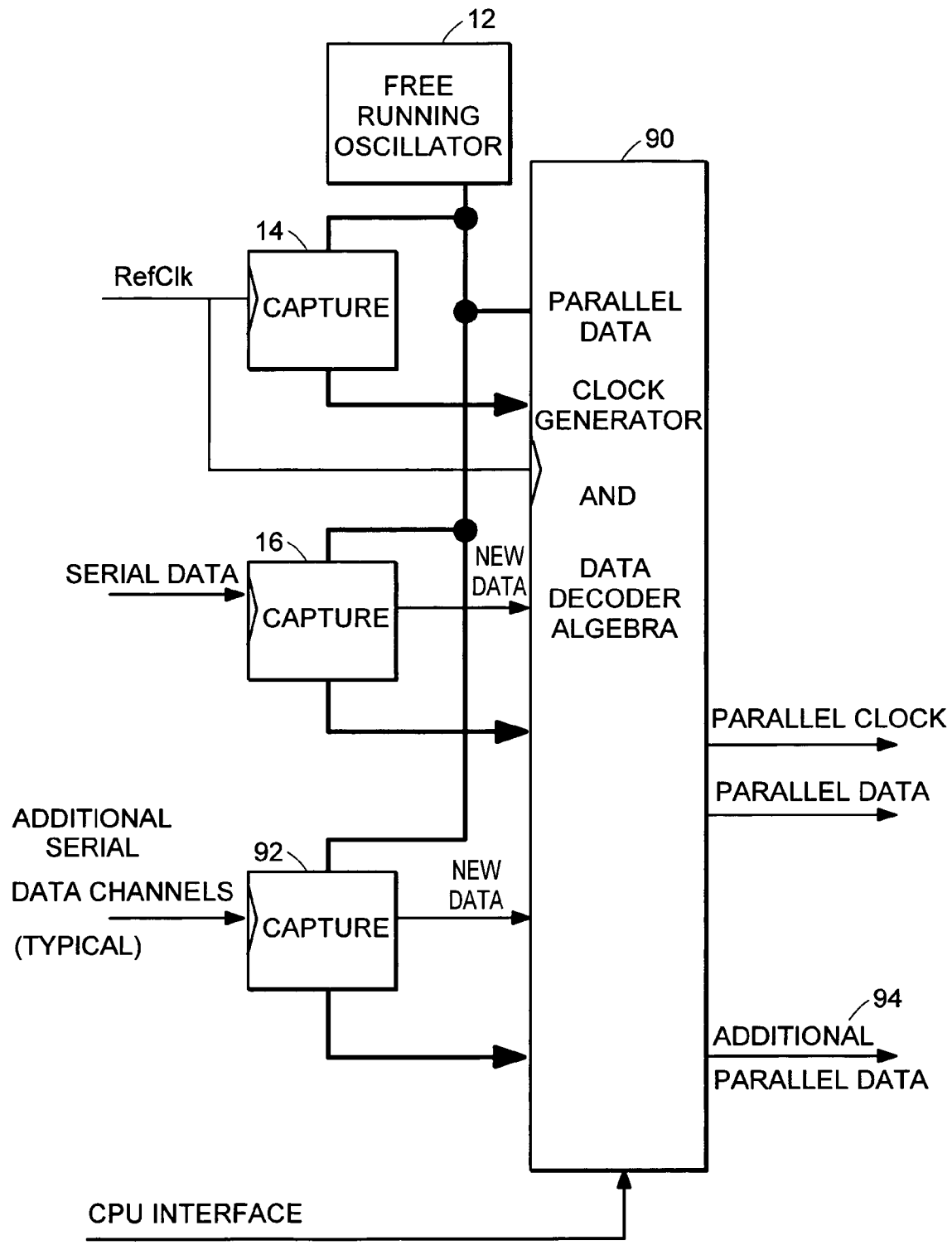
FIG. 6 is a block diagram of another clock and data recovery circuit that uses a free-running loop oscillator.

In a second embodiment, illustrated in FIG. 6, all of the work is done digitally. That is, instead of generating a synthesized clock for clocking the serial data into a shift register, as was described in connection with the circuit illustrated by FIG. 1, all time-stamps for the reference clock and the serial data stream(s) are processed digitally by parallel clock generator and data decoder algebra 90 to extract the received data and whatever other information is required from the received signal. The clock is recovered, for example, by using statistical averaging of the time-stamps and the data is recovered by using other known techniques to compute the data from the time-stamps for the serial data stream and the reference clock signal.

Typically, all transitions of both polarities are captured (i.e., time-stamped). The data decoder algebra works with the parallel clock generation algebra to digitally filter the signal transition time-stamps and receive the data. Various digital filtering techniques may be used depending on the expected transition patterns in the serial input, such as time-stamp averaging and pattern recognition. The data is output through a parallel interface with the generated data clock.

There are various filtering concepts that can be used to look at the time-stamps of the received signal transitions that are "noisy." For example, from the specifications for the serial interface, the normal time between transitions in the received signal is known, so an error can be determined for each time stamp from the ideal values. Three examples of how time errors can be processed to look for trends are as follows:

1. If the "ideal signal" is, on average, slightly faster or slightly slower than the received signal, the ideal signal can be corrected to match the bit rates.
2. The errors would also be analyzed for frequency modulations, for example, such as when 60 Hz AC noise is coupling into the signal. In that case, the modulation can be modeled, predicted, and removed from the time-stamps before generating the received data.
3. If the errors show a trend where 0 to 1 transitions are either earlier or later than 1 to 0 transitions, then the received threshold voltage in the interface can be adjusted to remove this error, or this effect can be modeled, predicted, and removed.

As with the approach illustrated by FIG. 1, this circuit can be extended to support multiple serial channels by adding capture blocks 92 and additional parallel outputs 94.

The approach represented by FIG. 6 has the advantage that a high-speed clock need not be generated. Instead, only a slower speed clock for the parallel data will be necessary. Moreover, performing the functions through digital processing provides much greater potential for correcting for problems in the signal and for doing so dynamically. Thus, the approach might be particularly appropriate if the signal quality of the serial data is so poor that a correct sampling time cannot be determined, when setup and hold times for the sampling flip-flop cannot be reliably met, or when multiple interface standards must be managed by one interface.

As a practical matter, when the above-described circuitry is implemented on an integrated circuit chip, it is desirable to locate the capture modules physically close to each other so that they will tend to see the same electrical environment and will more closely share the same processes parameters. That is, it is important to make those design choices that provide greater assurance that these modules will closely track each other in performance under different operating and environmental conditions to which the chip will likely be exposed.

Other embodiments are within the following claims. For example, though we have illustrated a free-running loop oscillator that has 16 taps (for generating 16 equally spaced phases of a signal), one could use fewer taps (e.g. 4 taps) or more taps (e.g. 32 taps). The number of taps that are used are depends on how much processing one wants to do in the clock generator algebra module and how fast the lap counter is. Fewer taps requires a faster lap counter and a larger number of taps requires greater processing power.

In addition, the methods and circuits described herein can be used for a wide variety of different applications that require clock and data recovery from serial data streams, including applications that involve the processing serial data from optical storage or from RF communications, both of which were mentioned above.

What is claimed is:

1. A method of processing a serial data stream carrying data at a rate established by an underlying clock signal, said method comprising:
generating a plurality of oscillatory signals that are the same frequency and are separated in phase by substantially equal amounts;
generating a lap count which is a count of the number of times that a particular one of the plurality of oscillatory signals has gone through a complete cycle;
time-stamping each of the transitions of a sequence of transitions within the serial data stream to thereby generate a sequence of time-stamps, wherein time-stamping of each of the transitions of the sequence of transitions within the serial data stream involves capturing the state of said plurality of oscillatory signals and the lap count at the time of that transition; and
based at least in part on the sequence of time-stamps, recovering the data from the serial data stream.

2. The method of claim 1 further comprising parallelizing the recovered data from the serial data stream.

3. The method of claim 2 wherein parallelizing the recovered data from the serial data stream involves clocking the recovered serial data into a shift register and outputting the clocked-in recovered data in parallel in groups of n bits where n is an integer greater than one.

4. The method of claim 1 wherein recovering the data from the serial data steam involves, based at least in part on the sequence of time-stamps for the sequence of transitions within the serial data stream, synthesizing the underlying clock signal and using the synthesized clock signal to recover the data from the serial data stream.

5. A method of processing a serial data stream carrying data at a rate established by an underlying clock signal, said method comprising:
time-stamping each of the transitions of a sequence of transitions within the serial data stream to thereby generate a first sequence of time-stamps;
supplying a reference clock signal;
time-stamping each of the transitions of a sequence of transitions within the reference clock signal to thereby generate a second sequence of time-stamps; and
based at least in part on the first sequence of time stamps and the second sequence of time stamps, recovering the data from the serial data stream and recovering the underlying clock signal.

6. The method of claim 5, further comprising generating a plurality of oscillatory signals that are the same frequency and are separated in phase by substantially equal amounts, wherein time-stamping of each of the transitions of the sequence of transitions within the serial data stream involves capturing the state of said plurality of oscillatory signals at the time of that transition.

7. The method of claim 5 further comprising generating a plurality of oscillatory signals that are the same frequency and are separated in phase by substantially equal amounts, wherein time-stamping of each of the transitions of the sequence of transitions within the serial data stream involves capturing the state of said plurality of oscillatory signals at the time of that transition.

8. The method of claim 7, wherein time-stamping of each of the transitions of the sequence of transitions within the reference clock involves capturing the state of said plurality of oscillatory signals at the time of that transition.

9. The method of claim 7 further comprising generating a lap count which is a count of the number of times that a particular one of the plurality of oscillatory signals has gone through a complete cycle.

10. The method of claim 9 wherein capturing the state of said plurality of oscillatory signals at each of the transitions of the sequence of transitions within the serial data stream also involves capturing the lap count at the time of that transition.

11. The method of claim 10 wherein capturing the state of said plurality of oscillatory signals at each of the transitions of the sequence of transitions within the serial data stream also involves capturing the lap count at the time of that transition.

12. A circuit for processing a serial data stream carrying data at a rate established by an underlying clock signal, said serial data stream including a sequence of transitions at locations in time determined by the underlying clock signal and data within the serial data stream, said circuit comprising:
a free-running loop oscillator for generating a plurality of oscillatory signals that are the same frequency and are separated in phase by substantially equal amounts, said free-running loop oscillator also including a lap counter for generating a lap count which is a count of the number of times that a particular one of the plurality of oscillatory signals has gone through a complete cycle;
a serial data stream capture module which during operation receives the serial data stream and for each of the transitions of the sequence of transitions captures a corresponding state of the free-running loop oscillator and the lap count as a time-stamp of that transition; and
a data recovery module which during operation recovers the data within the serial data stream based, at least in part, on the captured state for the sequence of transitions, said data recovery module including a processor component which analyzes the captured state for the sequence of transitions.

13. The circuit of claim 12 further comprising a reference clock capture module which during operation receives a reference clock that is a sequence of reference clock transitions and which for each of the reference clock transitions of the sequence of reference clock transitions captures a state of the free-running loop oscillator, wherein the processing module uses the captured state for the sequence of reference clock transitions along with the captured state for the sequence of transitions within the serial data stream to recover the data within the serial data stream.

14. The circuit of claim 13 wherein the data recovery module further comprises a shift register arranged to receive the serial data stream and output parallel data, and a clock generator that generates a synthesized clock for the shift register in response to instructions received from the processor component.

15. The circuit of claim 14 wherein the data recovery module further comprises a second shift register arranged to receive a second the serial data stream and output corresponding parallel data, and a delay element which introduces a predetermined phase shift into the synthesized clock and provides the phase-shifted synthesized clock to the second shift register.

16. The circuit of claim 12 wherein the free-running loop oscillator comprises a plurality of buffer stages connected in series to form a loop, wherein each of the buffer stages of the plurality of buffer stages introduces a substantially equal amount of delay into a signal which circulates around the loop when it is oscillating, said oscillator further comprising a plurality of taps each of which is associated with a different one of the buffer stages and outputs a signal that indicates the state of that buffer.

17. A circuit for processing a serial data stream carrying data at a rate established by an underlying clock signal, said serial data stream including a sequence of transitions at locations in time determined by the underlying clock signal and data within the serial data stream, said circuit comprising:
a free-running loop oscillator;
a serial data stream capture module which during operation receives the serial data stream and for each of the transitions of the sequence of transitions captures a corresponding state of the free-running loop oscillator as a time-stamp of that transition;
a reference clock capture module which during operation receives a reference clock that is a sequence of reference clock transitions and which for each of the reference clock transitions of the sequence of reference clock transitions captures a state of the free-running loop oscillator; and
a data recovery module which during operation recovers the data within the serial data stream based, at least in part, on the captured state for the sequence of transitions within the serial data stream and the sequence of reference clock transitions, said data recovery module including a processor component which analyzes the captured state for the sequence of transitions,
wherein the data recovery module further comprises a first shift register arranged to receive the serial data stream and output parallel data, and a clock generator that generates a synthesized clock for the shift register in response to instructions received from the processor component, and
wherein the synthesized clock is a sequence of synthesized clock transitions, and said circuit further comprises a synthesized clock capture module which during operation receives the synthesized clock and for each of the transitions of the sequence of synthesized clock transitions captures a state of the free-running loop oscillator, wherein the data recovery module uses the captured state for the sequence of synthesized clock transitions to correct for undesired changes in the synthesized clock.

* * * * *

UNITED STATES PATENT AND TRADEMARK OFFICE
CERTIFICATE OF CORRECTION

PATENT NO. : 7,613,263 B2
APPLICATION NO. : 10/793149
DATED : November 3, 2009
INVENTOR(S) : Daniel J. Allen It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 656 days.

Signed and Sealed this

Nineteenth Day of October, 2010

David J. Kappos
*Director of the United States Patent and Trademark Office*